(12) United States Patent
Xu et al.

(10) Patent No.: US 10,101,649 B2
(45) Date of Patent: Oct. 16, 2018

(54) MASK PLATE

(71) Applicants: BOE TECHNOLOGY GROUP CO., LTD., Beijing (CN); CHONGQING BOE OPTOELECTRONICS TECHNOLOGY CO., LTD., Chongqing (CN)

(72) Inventors: Zhuo Xu, Beijing (CN); Yajie Bai, Beijing (CN); Xiaoyuan Wang, Beijing (CN); Jaikwang Kim, Beijing (CN); Fei Shang, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

( * ) Notice: Subject to any disclaimer, the term of this patent is extended or adjusted under 35 U.S.C. 154(b) by 50 days.

(21) Appl. No.: 15/298,376

(22) Filed: Oct. 20, 2016

(65) Prior Publication Data
US 2017/0123307 A1    May 4, 2017

(30) Foreign Application Priority Data
Oct. 29, 2015    (CN) .......................... 2015 1 0714183

(51) Int. Cl.
*G03F 1/38*    (2012.01)

(52) U.S. Cl.
CPC ...................... *G03F 1/38* (2013.01)

(58) Field of Classification Search
CPC .......................................... G03F 1/38
USPC .............................................. 430/5
See application file for complete search history.

(56) References Cited

U.S. PATENT DOCUMENTS

2006/0147813 A1* 7/2006 Tan .......................... G03F 1/34
430/5

\* cited by examiner

*Primary Examiner* — Christopher G Young
(74) *Attorney, Agent, or Firm* — Ladas & Parry LLP (57) ABSTRACT

A mask plate is disclosed. The mask plate includes a via hole pattern, the via hole pattern includes a body portion and at least two protruding portions extending outward from the body portion; a dimension of the body portion is greater than a resolution dimension of an exposure machine, and each of the protruding portions includes a first protruding portion having a dimension greater than the resolution dimension of the exposure machine. Upon exposure of the mask plate, the protruding portions themselves and zones between adjacent protruding portions form convex portions and concave portions of a via hole, respectively; in this way, a circumstance and also an edge area of the via hole as formed is increased and an electric resistance of the via hole is reduced effectively.

14 Claims, 8 Drawing Sheets

MASK PLATE

TECHNICAL FIELD

Embodiments of the present invention relate to a mask plate.

BACKGROUND

In designs for pixels and circuits, wirings of different metal layers need to be connected with each other through via holes. Generally, a square via hole or circular via hole is employed.

SUMMARY

At least one embodiment of the present invention provides a mask plate which effectively reduces an electric resistance of a via hole as formed.

In order to achieve the objective above, embodiments of the present invention adopt technical solutions as below.

A mask plate is provided, including a via hole pattern, the via hole pattern includes a body portion and at least two protruding portions extending outward from the body portion; a dimension of the body portion is greater than a resolution dimension of an exposure machine, each of the protruding portions includes a first protruding portion, and a dimension of the first protruding portion is greater than the resolution dimension of the exposure machine.

BRIEF DESCRIPTION OF THE DRAWINGS

In order to illustrate the technical solutions in the embodiments of the present disclosure more clearly, hereafter, the drawings of the embodiments will be described simply, obviously, the drawings described below are only some embodiments of the present disclosure, and not the limitations of the present disclosure.

FIG. 2b illustrates a via hole profile formed upon exposure of the mask plate in FIG. 2a;

FIG. 3b illustrates a via hole profile formed upon exposure of the mask plate in FIG. 3a;

FIG. 4b illustrates a via hole profile formed upon exposure of the in FIG. 4a;

FIG. 5b illustrates a via hole profile formed upon exposure of the mask plate in FIG. 5a;

FIG. 6b illustrates a via hole profile formed upon exposure of the mask plate in FIG. 6a;

FIG. 7b illustrates a via hole profile formed upon exposure of the mask plate in FIG. 7a;

FIG. 8b illustrates a via hole profile formed upon exposure of the mask plate in FIG. 8a;

FIG. 9b illustrates a via hole profile formed upon exposure of the mask plate in FIG. 9a.

DETAILED DESCRIPTION

In order to make the purposes, technical features and advantages of the embodiments of the present disclosure more obvious and understandable, hereafter, the technical solutions in the embodiments of the present disclosure will be clearly, completely described with reference to the drawings in the embodiments of the present disclosure. Obviously, the embodiments described are only a part of the embodiments, not all embodiments. Based on the embodiments in the present disclosure, all other embodiments obtained by one skilled in the art without paying inventive labor are within the protection scope of the present disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
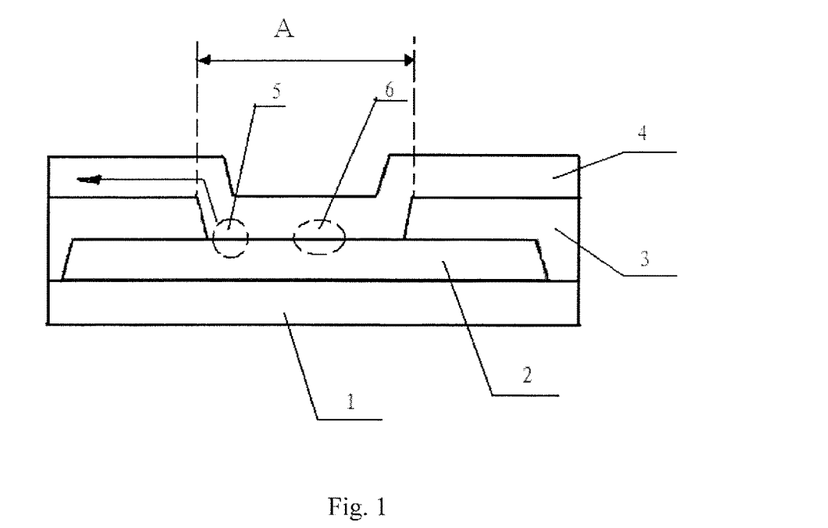
FIG. 1 is a structural schematic view illustrating a via hole for conductive connection.

FIG. 1 illustrates a design concept of a via hole bridging a metal layer and an indium tin oxide (ITO) layer thereby achieving circuit conduction, wherein a metal layer 2, a second insulating layer 3 and an ITO layer 4 arc stacked in this order on a first insulating layer 1, and the second insulating layer 3 is provided with a via hole A (as indicated by the dashed box in FIG. 1) therein so as to bridge the metal layer 2 and the ITO layer 4. Assuming that electric charges in FIG. 1 moves from the metal layer 2 towards the ITO layer 4 along the direction indicated by the arrow, that is, the electric charges pass through the via hole A and migrate to a position at the ITO layer 4 away from the via hole A, then the electric charges will choose a channel of smaller resistance. Still more specifically, considering an edge location of the via hole is equivalent to an electrical proximal end 5 while a central location of the via hole is equivalent to an electrical distal end 6, the electric charges would choose the electrical proximal end 5 in FIG. 1 for its migration instead of the electrical distal end 6. It follows that an edge zone of the via hole contributes most to the via hole resistance.

Comparing a square via hole with a circular via hole given identical areas, the square via hole having a greater circumference and edge zone has smaller resistance while the circular via hole having smaller circumference and edge zone has larger resistance.

Figure 2A:
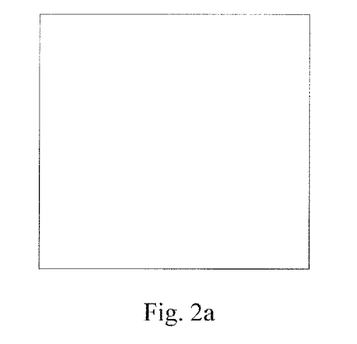
FIG. 2a illustrates a mask plate including a square via hole pattern.
Figure 2B:
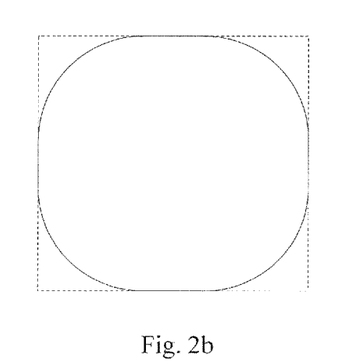

FIGS. 2a and 2b illustrate a comparison diagram of the mask plate including a square via hole pattern before and after its exposure, wherein FIG. 2a is the square via hole pattern before the exposure, and the FIG. 2b is the via hole profile as formed after the exposure. As can be seen from FIG. 2b, the square via hole pattern forms a via hole of approximate circular shape after the exposure, and accordingly, its resistance will become greater; this is because an angular position has a smaller amount of transmitted light so that a photoresist corresponding to the angular position can not be exposed sufficiently, which makes it difficult to form an angular profile.

Figure 3A:
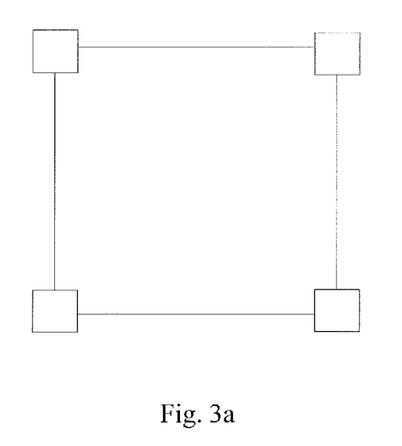
FIG. 3a illustrates an improved mask plate including a square via hole pattern.
Figure 3B:
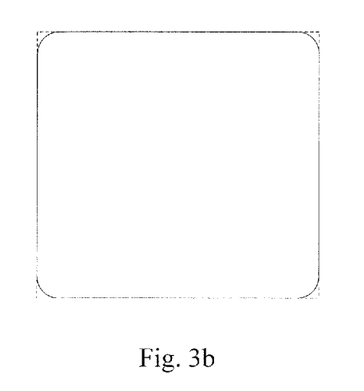

Such deficiency is commonly overcome by increasing the amount of transmitted light at angular positions, for example, by adding a pattern with a dimension smaller than a resolution dimension of an exposure machine as used for exposure at the angular position. In an example, a square opening pattern can be added at each of four corners of the square via hole pattern to improve the amount of transmitted light, wherein the dimension of the added square opening pattern is smaller than the resolution dimension of the exposure machine. FIG. 3a illustrates a mask plate including an improved square via hole pattern, and FIG. 3b illustrates a via hole as formed by the mask plate in FIG. 3a upon exposure. FIG. 3b tells that the improved design enhances the formation of angular profile of a via hole as compared with the normal design; however, a rounded profile at corners thereof substantively maintains unchanged, which still causes a greater via hole resistance as normally does.

The inventor of the present application has realized that, given the same via hole area, the key to reduce the via hole resistance is to increase the circumference.

Figure 4A:
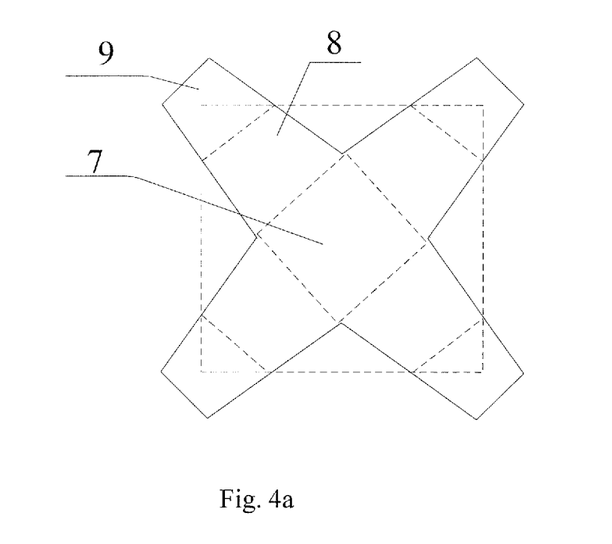
FIG. 4a is a schematic view of a mask plate including a square via hole pattern composed of four isosceles trapezoidal protruding portions as provided by an embodiment of present invention.

As illustrated in FIG. 4a, an embodiment of the present invention provides a mask plate including a via hole pattern, the via hole pattern includes a body portion 7 and at least two protruding portions extending outward from the body portion 7; wherein a dimension of the body portion 7 is greater than a resolution dimension of an exposure machine as used, and each of the protruding portion includes a first protruding portion 8 with a dimension greater than the resolution dimension of the exposure machine.

Figure 4B:
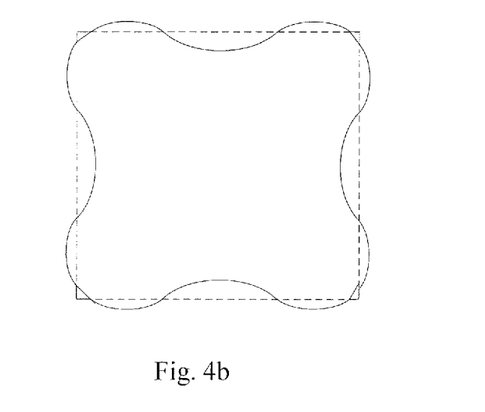

As above, the mask plate provided by this embodiment has a via hole pattern including the body portion 7 and at least two protruding portions extending outward from the body portion 7, so that the protruding portions themselves and zones between adjacent protruding portions, upon exposure by the exposure machine, will form convex portions and concave portions of a resulting via hole respectively, as illustrated in FIG. 4b, thereby increasing a circumference of the resulting via hole, enlarging an area of edge zone of the resulting via hole and effectively reducing the resistance of the resulting via hole.

In an example, still referring to FIG. 4a, each of the protruding portions of the via hole pattern further includes a second protruding portion 9 away from the body portion 7, and a dimension of the second protruding portion 9 is smaller than the resolution dimension of the exposure machine. In this way, during exposure, an amount of transmitted light at the first protruding portion 8 with greater dimension than the exposure machine is further increased.

In some examples, as illustrated in FIGS. 4a, 5a, 6a, 7a, 8a and 9a, three or four protruding portions are provided. However, those skilled would understand that the number of the protruding portions provided in these examples is configured for purpose of facilitating manufacturing process of the mask plate only and can be otherwise adjusted to further increase the circumference of the resulting via hole without particularly limited herein. The via holes formed upon exposing the via hole patterns as illustrated in FIGS. 4a, 5a, 6a, 7a, 8a and 9a are illustrated in FIGS. 4b, 5b, 6b, 7b, 8b and 9b, respectively.

In some examples, still referring to FIGS. 4a, 5a, 6a, 7a, 8a and 9a, the protruding portions have equal, included angles therebetween. It should be understood that these equal, included angles ensure a uniform distribution of convex portions at a peripheral region of the via hole as formed upon exposure of the via hole pattern and hence to increase the circumference of the via hole while ensuring a convenience in manufacturing process. Still, as illustrated in FIGS. 4b, 5b, 6b, 7b, 8b and 9b, plural convex portions are distributed evenly at the peripheral region of the via hole as formed upon exposure.

Figure 7A:
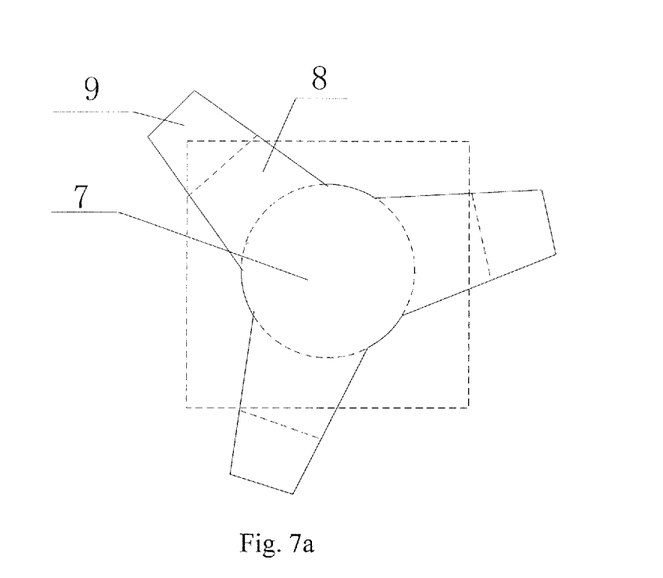
FIG. 7a is a schematic view of a mask plate including a square via hole pattern composed of three isosceles trapezoidal protruding portions as provided by an embodiment of present invention.
Figure 7B:
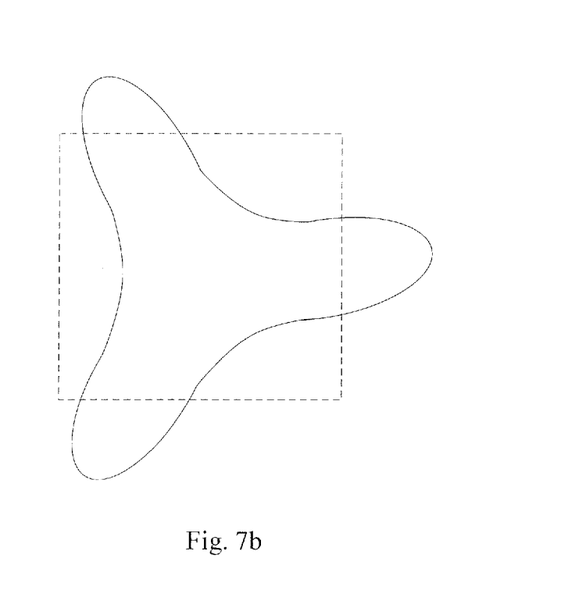
Figure 8A:
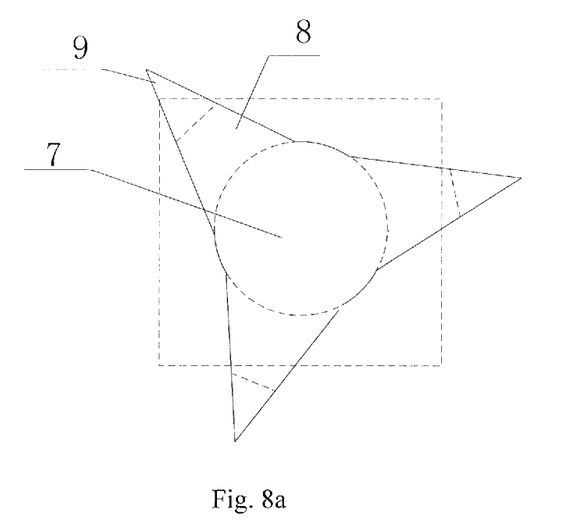
FIG. 8a is a schematic view of a mask plate including a square via hole pattern composed of three isosceles triangular protruding portions as provided by an embodiment of present invention.
Figure 8B:
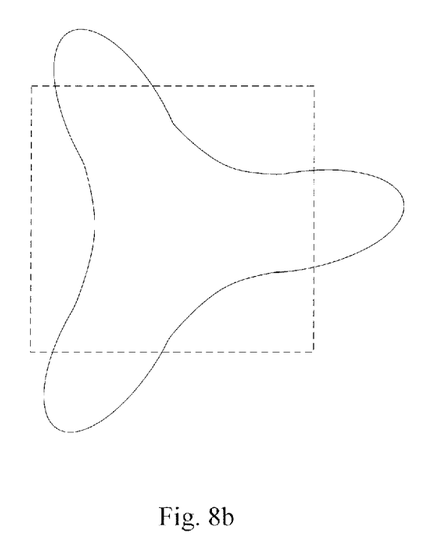
Figure 9A:
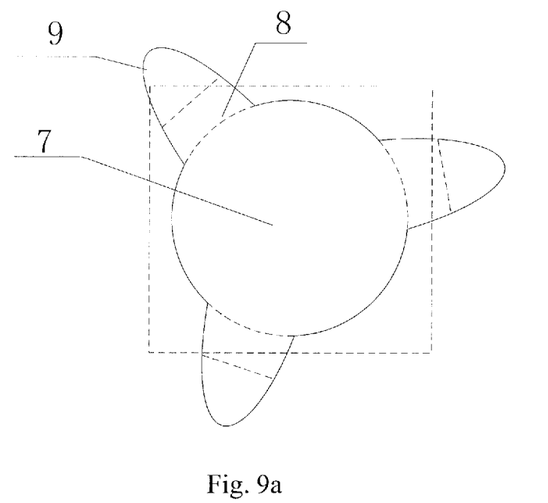
FIG. 9a is a schematic view of a mask plate including a square via hole pattern composed of three oval protruding portions as provided by an embodiment of present invention.
Figure 9B:
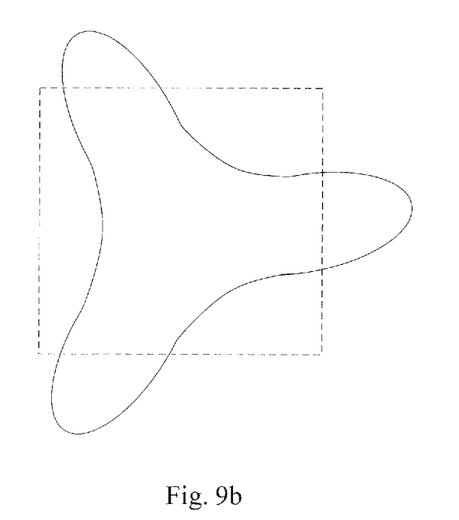

In some examples as illustrated in FIGS. 7a, 8a and 9a, three protruding portions are provided for the via hole pattern, and the included angles between the three protruding portions are 120°.

Figure 5A:
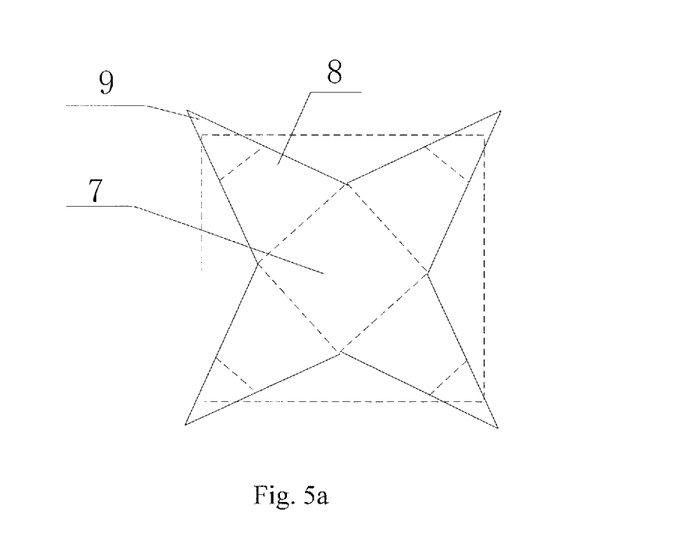
FIG. 5a is a schematic view of a mask plate including a square via hole pattern composed of four isosceles triangular protruding portions as provided by an embodiment of present invention.
Figure 5B:
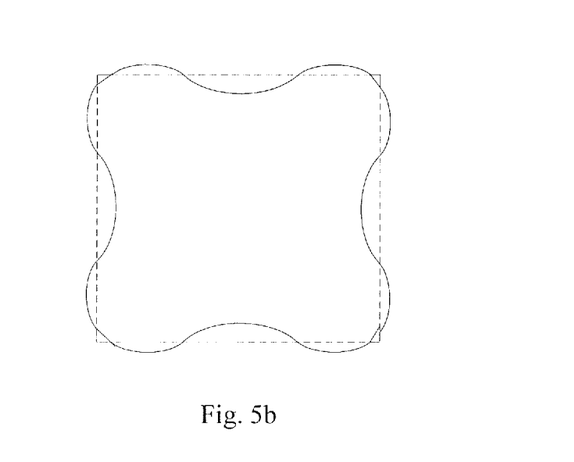
Figure 6A:
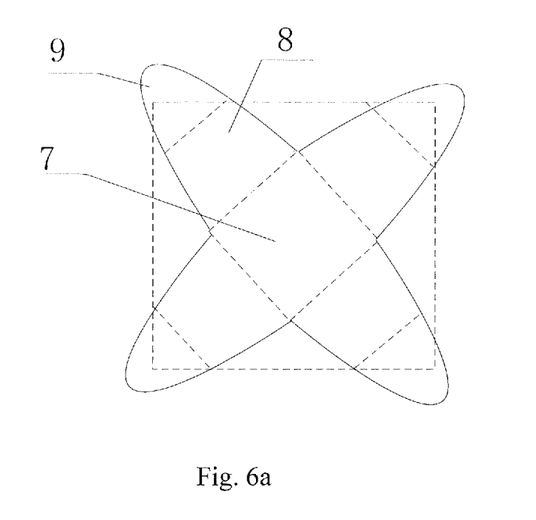
FIG. 6a is a schematic view of a mask plate including a square via hole pattern composed of four oval protruding portions as provided by an embodiment of present invention.
Figure 6B:
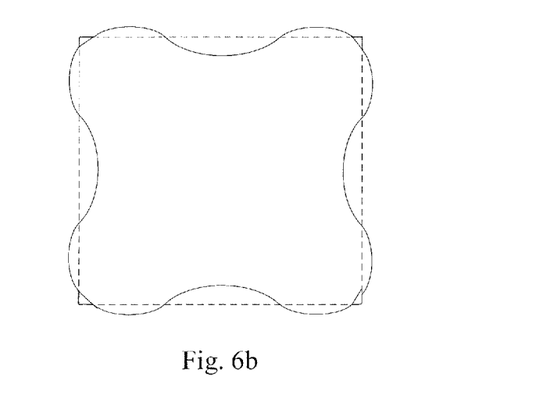

In some examples as illustrated in FIGS. 4a, 5a and 6a, four protruding portions are provided for the via hole pattern, and the included angles between the four protruding portions are 90°.

In some examples still as illustrated in FIGS. 4a, 5a, 6a, 7a, 8a and 9a, the protruding portions have identical shapes and dimensions. In this way, it facilitates the manufacturing process of the mask plate.

In some examples still as illustrated in FIGS. 4a, 5a, 6a, 7a, 8a and 9a, each of the protruding portions has a shape of any one of isosceles trapezoid, isosceles triangle and oval. In this way, the second protruding portion 9 and the first protruding portion 8 can be easily contained in a single pattern simultaneously, and a dimension gradually varied from the first protruding portion 8 to the second protruding portion 9 can also be provided, thereby ensuring a continuity of the profile of the resulting via hole formed upon exposure.

In some examples as illustrated in FIGS. 4a and 7a, the isosceles trapezoidal-shaped protruding portion includes a first protruding portion 8 close to the body portion 7 and a second protruding portion 9 away from the body portion 7.

In some examples as illustrated in FIGS. 5a and 8a, the isosceles triangular-shaped protruding portion includes a first protruding portion 8 close to the body portion 7 and a second protruding portion 9 away from the body portion 7.

In some examples as illustrated in FIGS. 6a and 9a, the oval-shaped protruding portion further includes a first protruding portion 8 close to the body portion 7 and a second protruding portion 9 away from the body portion 7.

It should be appreciated that, according to the embodiments of the present invention, the protruding portion of the via hole pattern has a portion with a greater dimension disposed to be close to the body portion 7 and a portion with a smaller dimension disposed to be away from the body portion 7. In some examples, the dimension of the protruding portion can be configured to be tapered from the portion close to the body portion 7 to the portion away from the body portion 7.

In some examples, the body portion 7 and each of the protruding portion have their edges matching with each other. In this way, a location where the body portion 7 meshes with the protruding portion is relatively smooth, which allows a profile of the via hole as formed upon exposure smooth.

In some examples, a square equivalent to the via hole pattern has its side length in a range of 3 to 15 µm. As illustrated in FIG. 4a, the square indicated by the dashed line is just the square equivalent to the via hole pattern and has its side length in an extent adapted to requirements of most of the pattern designs and manufacturing technologies.

It's to be understood that the above embodiments are only exemplary embodiments used for explaining the principle of the present invention without limiting the scope thereof. As would be obvious to the ordinary skilled in this art, when exposure machines with different resolution dimensions are used, the dimensions of the body portion 7, the first protruding portion 8 and the second protruding portion 9 would be changed correspondingly. Moreover, various modification and variations can be made without departing from the spirit and essence of the present invention, and shall be regarded as fallen with the scope of the present invention.

The present application claims the benefits of Chinese patent application No. 201510714183.8 filed with the SIPO on Oct. 29, 2015, which is fully incorporated herein by reference as part of this application.

What is claimed is:

1. A mask plate comprising a via hole pattern, the via hole pattern comprising a body portion and at least two protruding portions extending outward from the body portion,
   a dimension of the body portion being greater than a resolution dimension of an exposure machine; and each of the protruding portions comprising a first protruding portion, a dimension of the first protruding portion being greater than the resolution dimension of the exposure machine,
   the protruding portion themselves and zones between adjacent protruding portions, upon exposure by the exposure machine, defining convex portions and concave portions of a resulting via hold respectively.

2. The mask plate according to claim 1, wherein each of the protruding portions further comprises a second protruding portion away from the body portion, a dimension of the second protruding portion is smaller than the resolution dimension of the exposure machine.

3. The mask plate according to claim 1, wherein three or four protruding portions are provided.

4. The mask plate according to claim 1, wherein the at least two protruding portions have identical, included angles therebetween.

5. The mask plate according to claim 4, wherein three protruding portions are provided, and the included angles between the three protruding portions are 120°.

6. The mask plate according to claim 4, wherein four protruding portions are provided, and the included angles between the four protruding portions are 90°.

7. The mask plate according to claim 1, wherein the at least two protruding portions have identical shapes and dimensions.

8. The mask plate according to claim 1, wherein the dimension of each of the protruding portions is configured to be tapered from a portion dose to the body portion towards a portion away from the body portion.

9. The mask plate according to claim 1, wherein each of the protruding portions has a shape of any one of isosceles trapezoid, isosceles triangle and oval.

10. The mask plate according to claim 9, wherein the isosceles trapezoid comprises a first portion close to the body portion and a second portion away from the body portion.

11. The mask plate according to claim 9, wherein the isosceles triangle comprises a first portion close to the body portion and a second portion away from the body portion.

12. The mask plate according to claim 9, wherein the oval comprises a first portion close to the body portion and a second portion away from the body portion.

13. The mask plate according to claim 1, wherein the body portion and each of the protruding portions have their edges matching with each other.

14. The mask plate according to claim 1, wherein a square equivalent to the via hole pattern has its side length in a range of 3 µm-15 µm.

* * * * *